United States Patent
Yamaguchi

(10) Patent No.: US 6,344,680 B1
(45) Date of Patent: Feb. 5, 2002

(54) PLANAR SEMICONDUCTOR DEVICE

(75) Inventor: Koji Yamaguchi, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/527,817

(22) Filed: Mar. 17, 2000

(30) Foreign Application Priority Data

Apr. 2, 1999 (JP) .......................................... 11-096160

(51) Int. Cl.[7] ...................... H01L 23/58; H01L 23/544; H01L 29/76; H01L 29/788; H01L 29/94

(52) U.S. Cl. .................. 257/630; 257/639; 257/640; 257/797; 257/411; 257/316; 257/320

(58) Field of Search ................ 257/630, 639, 257/640, 644, 797, 411, 316, 320, 321, 635, 649, 620, 621

(56) References Cited

U.S. PATENT DOCUMENTS

| | | | | |
|---|---|---|---|---|
| 4,835,592 A | * | 5/1989 | Zommer ...................... | 357/68 |
| 5,237,199 A | * | 8/1993 | Morita ........................ | 257/638 |
| 5,300,816 A | * | 4/1994 | Lee et al. .................... | 257/797 |
| 5,302,854 A | * | 4/1994 | Nishiguchi et al. .......... | 257/737 |
| 5,449,941 A | * | 9/1995 | Yamazaki et al. .......... | 257/411 |
| 5,502,332 A | * | 3/1996 | Ikemasu et al. ............. | 257/620 |
| 5,557,505 A | * | 9/1996 | Silva ........................... | 361/777 |
| 5,578,867 A | * | 11/1996 | Argos, Jr. et al. ........... | 257/632 |
| 5,618,380 A | * | 4/1997 | Siems et al. ................. | 438/14 |
| 5,763,936 A | * | 6/1998 | Yamaha et al. .............. | 257/644 |
| 5,907,181 A | * | 5/1999 | Han et al. .................... | 257/630 |
| 6,118,185 A | * | 9/2000 | Chen et al. .................. | 257/797 |
| 6,246,108 B1 | * | 6/2001 | Corisis et al. ............... | 257/666 |

FOREIGN PATENT DOCUMENTS

| | | | | | |
|---|---|---|---|---|---|
| JP | 404223359 A | * | 8/1992 | | |
| JP | 404369258 A | * | 12/1992 | .................... | 23/50 |
| JP | 0610922 A2 | * | 8/1994 | ................. | 27/108 |

* cited by examiner

*Primary Examiner*—Matthew Smith
*Assistant Examiner*—Chuong A. Luu
(74) *Attorney, Agent, or Firm*—Kanesaka & Takeuchi

(57) ABSTRACT

In a semiconductor chip with a planar structure, the width of each corner portion of a peripheral electrode in a diagonal direction of the chip is made almost the same as the width of each straight portion of the peripheral electrode, the peripheral electrode having the same potential as a drain electrode in the periphery of the chip. The corner portion of the peripheral electrode is in the form of a partial annular ring. Degradation of the withstand voltage in the semiconductor device is prevented in the high-temperature and high-humidity conditions.

3 Claims, 2 Drawing Sheets

PLANAR SEMICONDUCTOR DEVICE

BACKGROUND OF THE INVENTION AND RELATED ART STATEMENT

The present invention relates to a planar semiconductor device with a planar structure having an annular metallic film in a peripheral area of a chip, which is applicable to a MOSFET, an insulated gate bipolar transistor, a MOS gate thyristor and the like.

FIG. 3 is a perspective view of a resin-molded semiconductor device sealed with a resin. A semiconductor chip 21 is joined to a lead frame 22 and is sealed with a resin 23. Reference numeral 24 designates a wire connecting the lead frame 22 to the semiconductor chip 21.

FIG. 4 is a partial plan view of a corner portion of a vertical MOSFET chip, which is an example of a planar semiconductor device. A source electrode 2 constituting a cell portion through which a current is conducted, a withstand voltage structure section 3 with a field plate structure, and a peripheral electrode 4 are seen through a passivation film 1 covering almost the entire surface of the chip. Generally, the peripheral electrode 4 has the same potential as a drain electrode on the reverse surface.

FIG. 5 is a partial sectional view taken along line 5—5 in FIG. 4. The left side of this view is a peripheral portion, the right side is the cell portion, and an intermediate withstand voltage structure is omitted. First, the cell portion is described. A p base region 6 is selectively formed on a surface layer of an n drift layer 5 with high resistivity. An $n^+$ source region 7 is formed inside the p base region 6, and the source electrode 2 is formed in contact with surfaces of both the p base region 6 and the $n^+$ source region 7. A gate electrode 9 is provided, via a gate oxide film 8, on the surface of the p base region 6 sandwiched by an exposed surface portion of the n drift layer 5 and the $n^+$ source region 7. Reference numeral 10 designates an interlayer insulation film for insulating the gate electrode 9 and the source electrode 2. Reference numeral 1 denotes a passivation film.

In the peripheral portion of the chip, a $p^+$ peripheral region 12 is formed on a surface layer of the n drift layer 5, the peripheral electrode 4 is formed in contact with a surface of the $p^+$ peripheral region 12, and the passivation film 1 covers the peripheral electrode 4. The peripheral electrode 4 has a potential equal to that of a drain electrode (not shown) and is extended over a thick field oxide film 13 constituting the withstand voltage structure section to form a channel stopper. The peripheral electrode 4 and the source electrode 1 are typically comprised of an aluminum alloy containing silicon.

The corner portion of a rectangular MOSFET chip, particularly an inside of the corner portion, is normally shaped to have a curvature (this shape is hereafter referred to as a "curved shape") instead of a pattern with an acute angle, in order to weaken the electric field in the chip if a voltage is applied in an off-condition.

In the corner portion in FIG. 4, the outer end of the source electrode 2, the inside of the withstand voltage structure section 3 and the peripheral electrode 4 are formed into curved shapes, that is, quarter-circular arcs.

The outside of the outer end of the peripheral electrode 4, however, is often formed to have an almost right-angle corner instead of a curved shape in order to maintain contact with the peripheral region 12 and to stably apply a voltage to the drain electrode. Thus, the width of the corner portion of the peripheral electrode 4 is about three times larger than that of the straight portion.

The results on high-temperature and high-humidity reliability tests on such chips, however, indicate that in some chips, the withstand voltage characteristic becomes degraded. When such a degraded chip is examined, cracks are found in the passivation film 1 of the element, and many of them are present in the outer peripheral portions and corner portions of the chip.

This is because stress is concentrated on the outer peripheral portions and corner portions of the chip and because the cracks are developed as a result of thermal stress originating from a heat cycle or a power cycle. In particular, for a molded element comprising a chip sealed with a resin, stress concentration is severe due to an additional residual stress in the resin. Another reason is a large difference in thermal expansion coefficient between the aluminum alloy constituting the peripheral electrode and silicon nitride constituting the passivation film.

When such a semiconductor device is placed in a high-temperature and high-humidity environment, the atmosphere around the chip or moisture in the resin enters through the cracks into the passivation film. On the other hand, the cracks may develop and cause the passivation film to peel off, thereby exposing an aluminum electrode in the underlayer, which reacts with moisture in the atmosphere. The aluminum alloy electrode corrodes due to local battery action or the like, degrading the withstand voltage characteristic of the semiconductor device.

In view of this problem, it is an object of the present invention to provide a reliable semiconductor device by preventing cracks, particularly in the portions of the passivation film located in the chip corners.

SUMMARY OF THE INVENTION

To attain the object, the present invention provides a planar semiconductor device having a metallic film in the form of a closed ring in a peripheral area of a square semiconductor chip. The metallic film is covered with a passivation film. The width of a portion of the metallic film located in each corner portion of the chip in a chip-diagonal direction is almost the same as the width of each straight portion of the metallic film.

The most common shape of the metallic film is, for example, a partial annular ring.

This configuration reduces the difference in thermal expansion between the passivation film and the metallic film to prevent formation of cracks in the chip corner portions.

In particular, in a semiconductor device sealed with a molding resin, stress concentration due to residual stress or the like in the molding resin is likely to cause cracks. The above configuration, however, alleviates the stress concentration.

DETAILED DESCRIPTION OF REFERRED EMBODIMENTS

Figure 1:
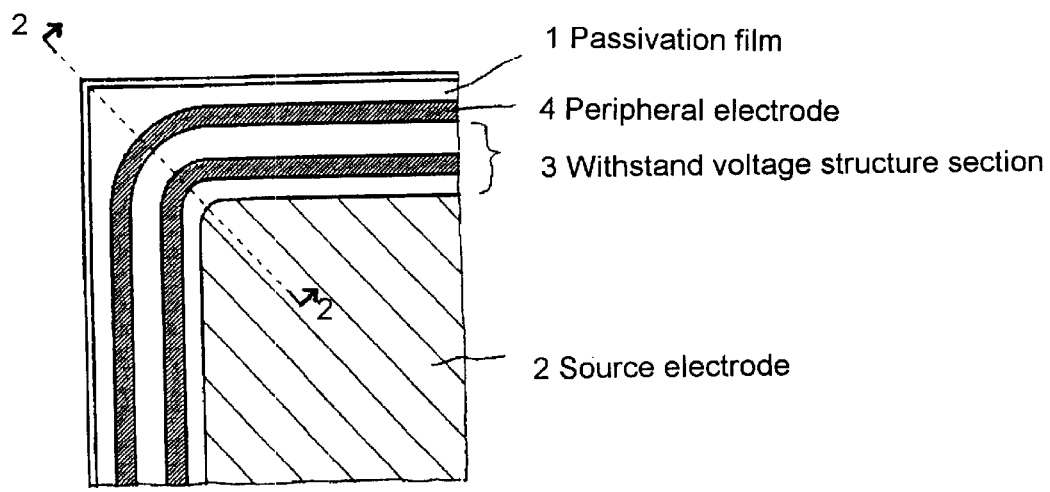
FIG. 1 is a partial plan view of a vertical MOSFET according to an embodiment of the present invention.

FIG. 1 is a plan view of a corner portion of a vertical MOSFET chip, i.e. one embodiment of the present invention. A source electrode 2 constituting a cell portion through which a current is conducted, a withstand voltage structure section 3 with a field plate structure, and a peripheral electrode 4 are seen through a passivation film 1 covering almost all the entire surface of the chip. The peripheral electrode 4 has the same potential as a drain electrode (not shown).

Figure 3:
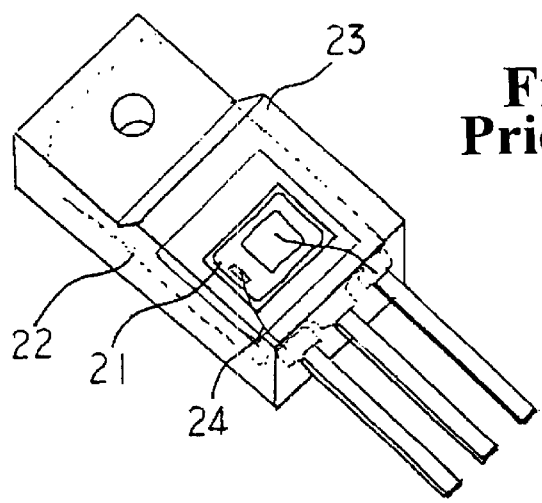
FIG. 3 is a perspective view of a conventional resin-mold semiconductor device.

This MOSFET differs from the conventional MOSFET in FIG. 3 in that the outside of the peripheral electrode 4 has a curved shape to have almost the same width as in the straight portion, i.e. partially circular annular shape.

Figure 2:
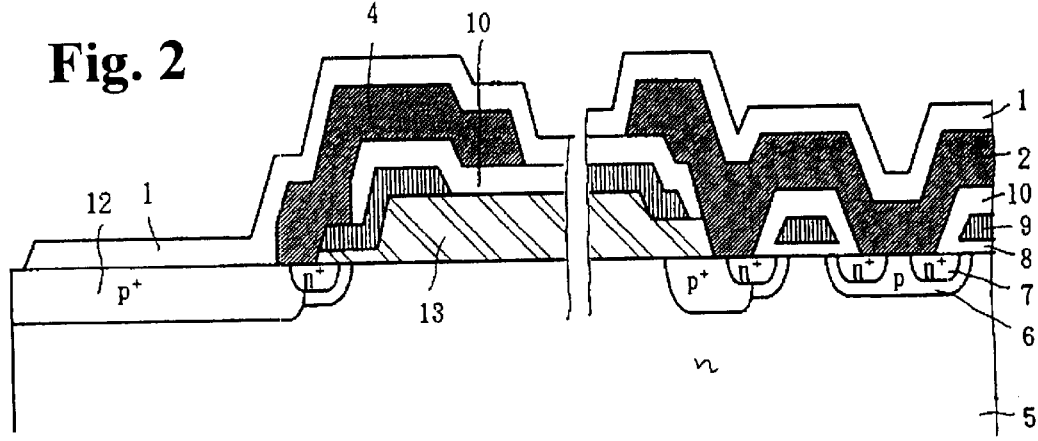
FIG. 2 is a partial sectional view of the MOSFET taken along line 2—2 in FIG. 1.

FIG. 2 is a partial sectional view taken along line 2—2 in FIG. 1. The left part of this view is a peripheral portion, and the right part is the cell portion through which a current is conducted. The intermediate withstand voltage structure section is omitted. First, the cell portion is described. A p base region 6 is selectively formed on a surface layer of an n drift layer 5 with high resistivity. An $n^+$ source region 7 is formed inside the p base region 6, and the source electrode 2 is formed to contact the surfaces of both p base region 6 and $n^+$ source region 7. A gate electrode 9 of polycrystalline silicon is provided on the surface of the p base region 6, via a gate oxide film 8, which is sandwiched between an exposed surface portion of the n drift layer 5 and the $n^+$ source region 7. Reference numeral 10 designates an interlayer insulation film, such as boron phosphorus silicate glass or the like, for insulating the gate electrode 9 and the source electrode 2. Reference numeral 1 denotes a passivation film of silicon nitride. The source electrode 2 is an aluminum alloy containing silicon.

Figure 4:
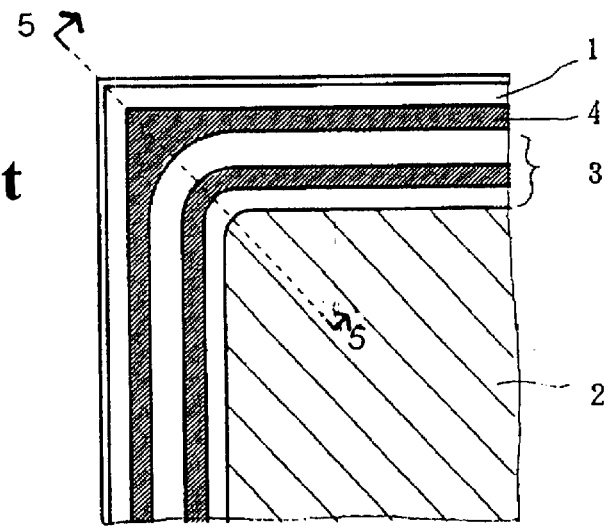
FIG. 4 is a partial plan view of a conventional vertical MOSFET.
Figure 5:
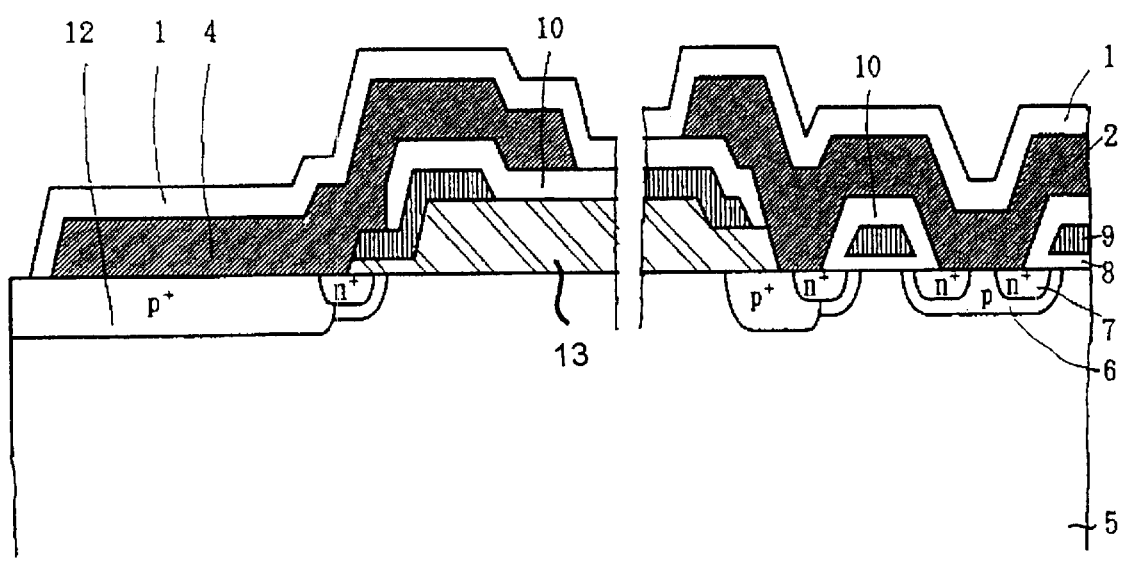
FIG. 5 is a partial sectional view of the MOSFET taken along line 5—5 in FIG. 4.

In the peripheral portion of the chip, a $p^+$ peripheral region 12 is formed on a surface layer of the n drift layer 5, and the peripheral electrode 4 is formed in contact with a surface of the $p^+$ peripheral region 12. This structure, however, requires the peripheral electrode 4 to contact only a silicon impurity diffusion layer in the $p^+$ peripheral region 12, and other portions of the $p^+$ peripheral region 12 are covered with the passivation film 1. The peripheral electrode 4 has a potential equal to that of a drain electrode and is extended over a thick field oxide film 13 to form a channel stopper, as in FIG. 4. Thus, the width of the peripheral electrode 4 in a diagonal direction of the chip is 40 $\mu$m, which is almost the same width as that of the straight portion, and about a quarter of the conventional size.

In such a MOSFET, the occurrence rate of cracks in the passivation film is reduced to about 10% of the conventional value or less. The results of long-time reliability tests in a high-temperature and high-humidity environment have shown that very few such MOSFETs suffer corrosion of the aluminum alloy or degradation of the voltage resistance, and the percentage of defective chips has decreased substantially. This is because the above configuration alleviates the stress in the passivation film.

Although the above embodiment has been described in conjunction with the example of a vertical semiconductor element with a peripheral electrode at the same potential as the drain electrode, the present invention is not limited to a vertical semiconductor element but may be a horizontal device or an integrated circuit.

As described above, according to the present invention, the width of the portion of the metallic film located in the corner portion of the square semiconductor chip in the chip-diagonal direction is almost the same as that of the straight portion of the metallic film, thereby substantially reducing the possibility of defects caused by corrosion of the metallic electrode or degradation of the withstand voltage that may occur under high humidity.

In particular, the present invention is effective in improving the reliability of general-purpose resin-semiconductor devices.

While the invention has been explained with reference to a specific embodiment of the invention, the explanation is illustrative and the invention is limited only by the appended claims.

What is claimed is:

1. A planar semiconductor device, comprising:
   a semiconductor chip having a square shape, and including a drift layer and a peripheral area formed on a surface layer of the drift layer,
   a metallic film having a closed ring shape formed on the peripheral area of the semiconductor chip, said metallic film operating as a peripheral electrode and including at least two straight portions and at least one corner portion in a form of a partial annular ring between said at least two straight portions, the width of the at least one corner portion of the metallic film located in a corner portion of the chip in a chip-diagonal direction being substantially same as the widths of the at least two straight portions of the metallic film so that the metallic film extends along an outer periphery of the chip with substantially the same width,
   a passivation film covering the metallic film, and
   a molding resin for sealing the semiconductor chip.

2. A planar semiconductor device according to claim 1, wherein said peripheral area includes a $p^+$ peripheral area having a silicon impurity diffusion layer, to which said peripheral electrode only contacts, said passivation film covering a remaining area of said peripheral area.

3. A planar semiconductor device according to claim 2, wherein said semiconductor chip includes a withstand voltage structure section extending along the outer periphery of the chip with a curved corner, said metallic film with substantially the same width extending along the withstand voltage structure section with the curved corner.

* * * * *